(12) United States Patent
Fan et al.

(10) Patent No.: US 11,191,123 B2
(45) Date of Patent: Nov. 30, 2021

(54) METHOD AND DEVICE FOR PERFORMING UPLINK TRANSMISSION

(71) Applicant: TELEFONAKTIEBOLAGET LM ERICSSON (PUBL), Stockholm (SE)

(72) Inventors: Rui Fan, Beijing (CN); Jinhua Liu, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 114 days.

(21) Appl. No.: 15/764,208

(22) PCT Filed: Jan. 18, 2018

(86) PCT No.: PCT/CN2018/073283
§ 371 (c)(1),
(2) Date: Mar. 28, 2018

(87) PCT Pub. No.: WO2018/141213
PCT Pub. Date: Aug. 9, 2018

(65) Prior Publication Data
US 2019/0059127 A1    Feb. 21, 2019

(30) Foreign Application Priority Data
Feb. 3, 2017    (WO) ................ PCT/CN2017/072813

(51) Int. Cl.
*H04W 76/27*    (2018.01)
*H04W 4/12*    (2009.01)
(Continued)

(52) U.S. Cl.
CPC ........ *H04W 76/27* (2018.02); *H03M 13/1111* (2013.01); *H04B 1/713* (2013.01);
(Continued)

(58) Field of Classification Search
CPC ... H04L 1/1887; H04L 5/0055; H04L 5/0087; H04L 5/0064; H04L 1/1621;
(Continued)

(56) References Cited

U.S. PATENT DOCUMENTS

2012/0057560 A1*  3/2012  Park .................... H04L 1/08
                                                    370/329
2012/0236804 A1*  9/2012  Lunttila ............... H04L 1/0027
                                                    370/329

(Continued)

FOREIGN PATENT DOCUMENTS

CN          1855907 A       11/2006
CN        102316562 A        1/2012
(Continued)

OTHER PUBLICATIONS

3GPP TSG RAN WG1 Meeting #87; Spokane, USA; Agenda item: 5.1.3.4; WF on consecutive transmission for URLLC; Huawei, HiSilicon, Ericsson, NTT Docomo, Spreadtrum, Intel (R1-1701319)—Jan. 16-20, 2017.
(Continued)

*Primary Examiner* — Mandish K Randhawa
(74) *Attorney, Agent, or Firm* — Baker Botts, LLP

(57) ABSTRACT

Embodiments of the disclosure generally relate to uplink transmission. A network device allocates resource regions for uplink transmission of a data packet of a terminal device. The resource regions are distributed across a plurality of carriers and correspond to consecutive transmission time intervals for transmitting the data packet. The network device transmits information about the resource regions to the terminal device to enable the terminal device to perform uplink transmission of the data packet based on the information.

14 Claims, 5 Drawing Sheets

(51) Int. Cl.
| | | |
|---|---|---|
| *H03M 13/11* | (2006.01) | |
| *H04B 1/713* | (2011.01) | |
| *H04L 1/16* | (2006.01) | |
| *H04W 72/04* | (2009.01) | |
| *H04W 80/02* | (2009.01) | |

(52) U.S. Cl.
CPC ............ *H04L 1/1621* (2013.01); *H04W 4/12* (2013.01); *H04W 72/0413* (2013.01); *H04W 72/0453* (2013.01); *H04W 80/02* (2013.01)

(58) Field of Classification Search
CPC ... H04L 5/0012; H04L 1/1893; H04L 5/0092; H04B 1/7143; H04B 1/713; H03M 13/1111; H04W 4/12; H04W 72/0453; H04W 80/02; H04W 72/042; H04W 72/0413; H04W 76/27
See application file for complete search history.

(56) References Cited

U.S. PATENT DOCUMENTS

| | | | |
|---|---|---|---|
| 2013/0329701 | A1 | 12/2013 | Bajzec et al. |
| 2015/0180621 | A1 | 6/2015 | Guan et al. |
| 2015/0288490 | A1 | 10/2015 | Sun et al. |
| 2019/0173522 | A1* | 6/2019 | Sun .......................... H04W 4/70 |

FOREIGN PATENT DOCUMENTS

| | | |
|---|---|---|
| CN | 104541459 A | 4/2015 |
| CN | 105356970 A | 2/2016 |
| WO | WO2006/116928 | 9/2006 |
| WO | 2016 028563 A1 | 2/2016 |

OTHER PUBLICATIONS

3GPP TSG RAN WG1 Meeting #88; Spokane, USA; WF on UL repetition number for URLLC; LG Electronics, Samsung; Agenda item: 8.1.3.4.3 (R1-1703786)—Jan. 16-20, 2017.

3GPP TSG-RAN WG1 Meeting #91; Reno, USA; Title: Time and Frequency Domain Resource Allocation with K Repetitions; Source: Fraunhofer IIS (R1-1720991)—Nov. 27-Dec. 1, 2017.

3GPP TSG-RAN WG2 Meeting #95bis; Kaohsiung, Taiwan; Source: Nokia, Alcatel-Lucent Shanghai Bell; Title: Intra-frequency multi-connectivity in standalone NR (R2-167044)—Oct. 10-14, 2016.

3GPP TSG-RAN WG2 NR Ad Hoc; Spokane, USA; Source: Huawei, HiSilicon; Title: MAC Structure an Operation for URLLC (R2-1700176)—Jan. 17-19, 2017.

3GPP TSG-RAN WG2 NR Ad Hoc; Spokane, USA; Source: CATT, Alcatel-Lucent Shanghai Bell, Nokia; Title: Packet duplication across legs (R2-1700192)—Jan. 17-19, 2017.

3GPP TSG-RAN WG2 NR Ad Hoc; Spokane, Washington, USA; Agenda item: 3.2.1.2; Source: Intel Corporation Title: Packet duplication for URLLC in DC and CA deployment (R2-1700336)—Jan. 17-19, 2017.

PCT Intenrational Search Report for International application No. PCT/CN2018/073283—dated Mar. 27, 2018.

3GPP TSG-RAN WG2 NR Ad Hoc; Spokane, USA; Source: Ericsson; Title: Overview of URLLC (Tdoc R2-1700393)—Jan. 17-19, 2017.

PCT Written Opinion of the Intenraitonal Searching Authority for International application No. PCT/CN2018/073283—dated Mar. 27, 2018.

European Patent Office; Communication pursuant to Rule 62 EPC; Application No. 18706949.7-1218 / 3375213; 7 pages, dated Nov. 26, 2019.

China Patent Office Official Action dated Dec. 1, 2020 in CN Application No. 201880000154.7, 11 pages (not translated).

"Correction to presence of uplink frequency hopping interval parameters," 3GPP TSG-RAN WGS Meeting #96, R2-169032, Nov. 14-18, 2016, 7 pages.

"Correction to presence of uplink frequency hopping interval parameters," 3GPP TSG-RAN WG2 Meeting #96, R2-169033, Nov. 14-18, 2016, 7 pages.

Government of India Office Action in India Application No. 201837006026 dated Dec. 21, 2020, 6 pages (translated).

* cited by examiner

METHOD AND DEVICE FOR PERFORMING UPLINK TRANSMISSION

PRIORITY

This nonprovisional application is a U.S. National Stage Filing under 35 U.S.C. § 371 of International Patent Application Serial No. PCT/CN2018/073283 filed Jan. 18, 2018, and entitled "*Method And Device For Performing Uplink Transmission*" which claims priority to international Patent Application Serial No. PCT/CN2017/072813 filed Feb. 3, 2017, all of which are hereby incorporated by reference in their entirety.

TECHNICAL FIELD

Embodiments of the present disclosure generally relate to the field of communications, and more particularly, to a method and device for performing uplink transmission.

BACKGROUND

With the development of communication technologies, multiple types of services or traffic have been proposed, for example, enhanced mobile broadband (eMBB) generally requiring high data rate, massive machine type communication (mMTC) typically requiring long battery lifetime, and ultra-reliable and low latency communication (URLLC). These services require different levels of Quality of Service (QoS), for instance, a delay, a data rate, a packet loss rate, and so on.

Due to strict requirements on both latency and reliability, one way to meet requirements of a URLLC service is to enable duplicate transmissions across different carriers concurrently or simultaneously. That is, a same data packet is transmitted over different carriers at the same time to achieve spatial and frequency diversity in a very short time.

However, an issue with such duplicate transmissions across different carriers is a transmit power constraint issue in uplink. Duplicate transmissions across carriers means that the transmit power of a terminal device needs to be divided to each of the carriers compared to single carrier transmission, which reduces Signal to Interference plus Noise Ratio (SINR) of each transmission. More concurrent multi-carrier transmission could increase Peak to Average Power Ratio (PAPR) of the transmitted signal, which lower a maximum total transmit power of the terminal device.

Therefore, there is a need to solve the uplink transmission problem for the URLLC service.

SUMMARY

In general, embodiments of the present disclosure provide a solution for performing uplink transmission.

In a first aspect, a method implemented at a network device is provided. A network device allocates resource regions for uplink transmission of a data packet of a terminal device. The resource regions are distributed across a plurality of carriers and correspond to consecutive transmission time intervals for transmitting the data packet. The network device transmits information about the resource regions to the terminal device to enable the terminal device to perform uplink transmission of the data packet based on the information. The corresponding computer program is also provided.

In one embodiment, the allocating resource regions for uplink transmission of a data packet of a terminal device may comprise: allocating the resource regions based on a frequency hopping pattern defining positions of the resource regions. The frequency hopping pattern may include one or more of: a number of resource regions in a carrier; a position of a resource region in a carrier; a size of a resource region in frequency domain; and a transmission time interval corresponding to a resource region.

In one embodiment, the frequency hopping pattern may be transmitted to the terminal device via a Radio Resource Control (RRC) signaling or predefined at both the network device and the terminal device.

In one embodiment, the data packet may be a Radio Link Control (RLC) Protocol Data Unit (PDU). In this case, the method may further comprise at least one of: transmitting an uplink grant to the terminal device on each of the carriers, the uplink grant including a size of a transport block equal to or larger than a size of the data packet; and in response to successfully decoding a transport block received from the terminal device on one of the resource regions, acknowledging successful transmission in all the carriers.

In one embodiment, the data packet may be a Media Access Control (MAC) PDU. In this case, the method may further comprise at least one of: transmitting one or more uplink grants to the terminal device on the carriers, the uplink grants including a same size of a transport block equal to or larger than a size of the data packet; and in response to receiving from the terminal device a plurality of versions of a transport block on the resource regions, performing soft combining of the versions of the transport block, and in response to successfully decoding the transport block based on the soft combining, acknowledging successful transmission in all the carriers.

In a second aspect, a method implemented at a terminal device is provided. The terminal device receives information about resource regions for uplink transmission of a data packet to a network device. The resource regions are distributed across a plurality of carriers and correspond to consecutive transmission time intervals for transmitting the data packet. The terminal device performs the uplink transmission of the data packet based on the information about the resource regions. The corresponding computer program is also provided.

In one embodiment, the performing the uplink transmission based on the information about the resource regions may comprise: determining the resource regions based on information about resource regions and a frequency hopping pattern defining positions of the resource regions, wherein the frequency hopping pattern includes one or more of: a number of resource regions in a carrier; a position of a resource region in a carrier; a size of a resource region in frequency domain; and a transmission time interval corresponding to a resource region.

In one embodiment, the frequency hopping pattern may be received from the network device via a RRC signaling or predefined at both the network device and the terminal device.

In one embodiment, the data packet is a RLC PDU. In this case, the method may further comprise: receiving from the network device an uplink grant on each of the carriers, the uplink grant including a size of a transport block equal to or larger than a size of the data packet; and transmitting the data packet in the transport block based on the uplink grant.

In one embodiment, the data packet is a MAC PDU. In this case, the method may further comprise: receiving from the network device one or more uplink grants on the carriers, the uplink grants including a same size of a transport block equal to or larger than a size of the data packet; and transmitting different versions of a transport block on the resource regions to the network device based on the uplink grants.

In a third aspect, an apparatus implemented at a network device is provided. The apparatus includes an allocating unit and a transmitting unit. The allocating unit is configured to allocate resource regions for uplink transmission of a data packet of a terminal device. The resource regions are distributed across a plurality of carriers and correspond to consecutive transmission time intervals for transmitting the data packet. The transmitting unit is configured to transmit information about the resource regions to the terminal device to enable the terminal device to perform uplink transmission of the data packet based on the information.

In a fourth aspect, an apparatus implemented at a terminal device is provided. The apparatus includes a receiving unit and a transmitting unit. The receiving unit is configured to receive information about resource regions for uplink transmission of a data packet to a network device. The resource regions are distributed across a plurality of carriers and correspond to consecutive transmission time intervals for transmitting the data packet. The transmitting unit is configured to perform the uplink transmission of the data packet based on the information about the resource regions.

In a fifth aspect, a network device is provided. The network device includes: a processor and a memory. The memory contains instructions executable by the processor, whereby the processor being adapted to cause the network device to perform the method according to the first aspect of the present disclosure.

In a sixth aspect, a terminal device is provided. The terminal device includes: a processor and a memory. The memory contains instructions executable by the processor, whereby the processor being adapted to cause the terminal device to perform the method according to the second aspect of the present disclosure.

According to embodiments of the present disclosure, the network device assigns the terminal device consecutive grants from a plurality of carriers in sequential transmission time intervals (TTIs)/subframes. Thus, the terminal device can transmit duplications of a data packet in the plurality of carriers in different TTI consecutively. Compared with the conventional solutions, since there is no power division between the transmissions on different carriers, the SINR can be increased without having any negative effect on the frequency diversity. At the same time, the PAPR increase is avoided. In this way, the performance of the communication system can be improved.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

Figure 1:
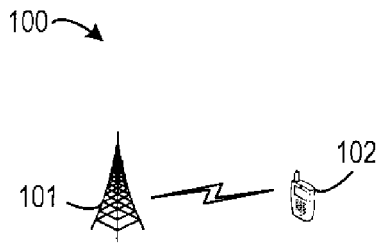
FIG. 1 shows a schematic diagram 100 of a wireless communication network.

The present disclosure will now be discussed with reference to several example embodiments. It should be understood that these embodiments are discussed only for the purpose of enabling those skilled persons in the art to better understand and thus implement the present disclosure, rather than suggesting any limitations on the scope of the present disclosure.

As used herein, the term "wireless communication network" refers to a network following any suitable communication standards, such as LTE-Advanced (LTE-A), LTE, Wideband Code Division Multiple Access (WCDMA), High-Speed Packet Access (HSPA), and so on. Furthermore, the communications between a terminal device and a network device in the wireless communication network may be performed according to any suitable generation communication protocols, including, but not limited to, the first generation (1G), the second generation (2G), 2.5G, 2.75G, the third generation (3G), the fourth generation (4G), 4.5G, the future fifth generation (5G) communication protocols, new radio (NR) communication protocols, and/or any other protocols either currently known or to be developed in the future.

The term "network device" refers to a device in a wireless communication network via which a terminal device accesses the network and receives services therefrom. The network device refers a base station (BS), an access point (AP), a Mobile Management Entity (MME), Multi-cell/Multicast Coordination Entity (MCE), a gateway, a server, a controller or any other suitable device in the wireless communication network. The BS may be, for example, a node B (NodeB or NB), an evolved NodeB (eNodeB or eNB), a Remote Radio Unit (RRU), a radio header (RH), a remote radio head (RRH), a relay, a low power node such as a femto, a pico, and so forth.

Yet further examples of network device include multi-standard radio (MSR) radio equipment such as MSR BSs, network controllers such as radio network controllers (RNCs) or base station controllers (BSCs), base transceiver stations (BTSs), transmission points, transmission nodes, Multi-cell/multicast Coordination Entities (MCEs), core network nodes (e.g., MSCs, MMEs), O & M nodes, OSS nodes, SON nodes, positioning nodes (e.g., E-SMLCs), and/or MDTs. More generally, however, network device may represent any suitable device (or group of devices) capable, configured, arranged, and/or operable to enable and/or provide a terminal device access to the wireless communication network or to provide some service to a terminal device that has accessed the wireless communication network.

The term "terminal device" refers to any end device that can access a wireless communication network and receive services therefrom. By way of example and not limitation, the terminal device refers to a mobile terminal, UE, or other suitable device. The UE may be, for example, a Subscriber Station (SS), a Portable Subscriber Station, a Mobile Station (MS), or an Access Terminal (AT). The terminal device may include, but not limited to, portable computers, image capture terminal devices such as digital cameras, gaming terminal devices, music storage and playback appliances, a mobile phone, a cellular phone, a smart phone, a tablet, a wearable device, a personal digital assistant (PDA), a vehicle, and the like.

The terminal device may support device-to-device (D2D) communication, for example by implementing a 3GPP standard for sidelink communication, and may in this case be referred to as a D2D communication device.

As yet another specific example, in an Internet of Things (IOT) scenario, a terminal device may represent a machine or other device that performs monitoring and/or measurements, and transmits the results of such monitoring and/or measurements to another terminal device and/or a network equipment. The terminal device may in this case be a machine-to-machine (M2M) device, which may in a 3GPP context be referred to as a machine-type communication (MTC) device. As one particular example, the terminal device may be a UE implementing the 3GPP narrow band internet of things (NB-IoT) standard. Particular examples of such machines or devices are sensors, metering devices such as power meters, industrial machinery, or home or personal appliances, e.g. refrigerators, televisions, personal wearables such as watches etc. In other scenarios, a terminal device may represent a vehicle or other equipment that is capable of monitoring and/or reporting on its operational status or other functions associated with its operation.

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Now some exemplary embodiments of the present disclosure will be described below with reference to the figures.

Reference is made to FIG. 1, which shows a schematic diagram 100 of a wireless communication network. There illustrates a network device 101 and a terminal device 102 in the wireless communication network. In the example of FIG. 1, the network device 101 provides services, for example, the URLLC services, to the terminal device 102. The network device 101 transmits, to the terminal device 102, information about resource regions allocated to the terminal devices 102, for example, via Physical Downlink Control Channel (PDCCH) or enhanced PDCCH (ePDCCH).

It is to be understood that the configuration of FIG. 1 is described merely for the purpose of illustration, without suggesting any limitation as to the scope of the present disclosure. Those skilled in the art would appreciate that the wireless communication network 100 may include any suitable number of terminal devices and/or network devices and may have other suitable configurations. In some embodiments, the network device 101 may communicate with one or more terminal devices other than the terminal device 102.

Conventionally, for URLLC having strict requirements on both latency and reliability, an issue with duplicate transmissions across different carriers is a transmit power constraint issue in uplink. Duplicate transmissions across carriers means that the transmit power of a terminal device needs to be divided to each of the carriers compared to single carrier transmission, which reduces SINR of each transmission. More concurrent multi-carrier transmission could increase Peak to PAPR of the transmitted signal, which lower a maximum total transmit power of the terminal device.

To increase reliability of communication, LTE has introduced a technique called "TTI bundling". More specifically, in addition to normal retransmission according to fixed Hybrid Automatic Repeat reQuest (HARQ) Round-Trip Time (RTT), autonomous retransmission of one data packet in consecutive TTIs in the same carrier is also supported. Soft combining can be performed across the transmission at the receiver side to enhance the SINR of the received signal. This helps to meet both the residual Block Error Ratio (BLER) target and the total retransmission delay. However, the issue with TTI bundling in LTE is that retransmission are always within one carrier and at the same physical resource block (PRB) as scheduled for the first transmission. Thus, although the total delay is reduced and soft combining gain is achieved, the diversity gain in frequency domain is small.

In order to solve the above and other potential problems, embodiments of the present disclosure provide solutions for performing uplink transmission with both small latency and high reliability. The proposed solution enables transmission of one data packet using resource regions in different carriers between repeated transmissions of one packet in consecutive TTIs. For a certain TTI, the terminal device processes a single Physical Uplink Shared Channel (PUSCH) transmission using an available transmit power without power splitting. As such, frequency hopping is enabled between repeated transmissions of one packet across bundled TTIs (or subframes, slots, and the like).

Compared with the conventional solutions, since there is no power division or splitting between the transmissions on different carriers, the SINR can be increased without having any negative effect on the frequency diversity. At the same time, the PAPR increase can be avoided. As a result, the performance of the communication system can be improved.

Figure 2:
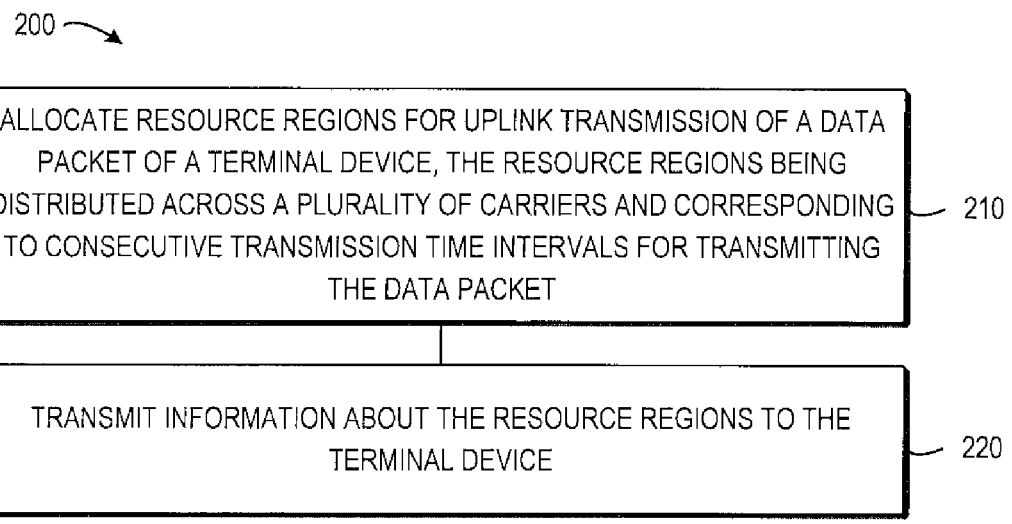
FIG. 2 shows a flowchart of a method 200 of performing uplink transmission at a network device in accordance with an embodiment of the present disclosure.

FIG. 2 shows a flowchart of a method 200 of transmitting downlink control information in accordance with an embodiment of the present disclosure. With the method 200, the above and other potential deficiencies in the conventional approaches can be overcome. It would be appreciated by those skilled in the art that the method 200 may be implemented by a network device, such as a BS, a server, a controller or other suitable devices. The network device may be, for example, but not limited to, the network device 101 of FIG. 1.

The method 200 is entered at 210, where the network device 101 allocates resource regions for uplink transmission of a data packet of a terminal device 102. In some embodiments, once the network device identifies that a bearer is used to carry a URLLC service, it may allocate resource regions for uplink transmission of a data packet.

Figure 8:
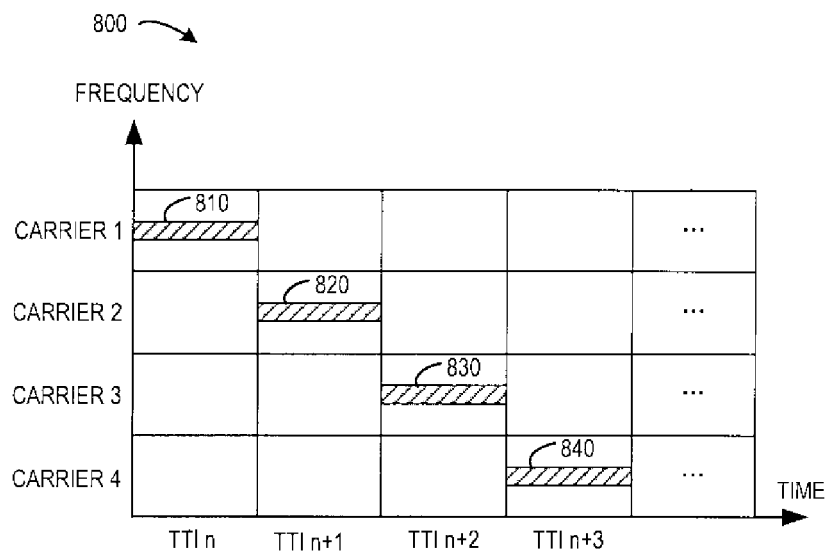
FIG. 8 shows a diagram 800 of resource regions in accordance with an embodiment of the present disclosure.
Figure 9:
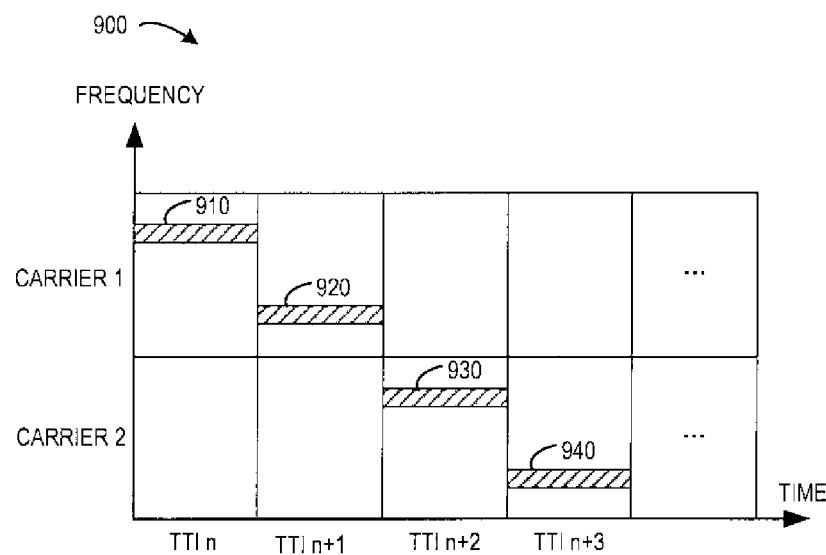
FIG. 9 shows a diagram 900 of resource regions in accordance with another embodiment of the present disclosure.

As used herein, the resource region refers to time-frequency resources allocated to the terminal device 102 for uplink transmission. The resource regions are distributed across a plurality of carriers and correspond to consecutive transmission time intervals for transmitting the same data packet. The resource region may include one or more resource blocks (RBs) or PRBs in frequency domain. According to embodiments, the resource regions may be distributed across the carriers in a variety of ways. FIGS. 8 and 9 show diagrams 800 and 900 of resource regions in accordance with embodiments of the present disclosure, respectively.

Embodiments of FIG. 8 illustrate a scheme of across carrier frequency hopping. In this example, for repeated transmission over different carriers, resource regions 810, 820, 830 and 840 that are located in carriers 1 to 4 are allocated to the terminal device 102. The resource regions 810, 820, 830 and 840 occupies four TTIs, namely, TTI n to TTI n+3, in time domain. Thus, repetitions of transmission of one data packet from a terminal device 102 can be located in different carriers 1-4 activated for the terminal device 102. In the example of FIG. 8, the number of the repetitions is equal to the number of the carries, and there is one transmission over each of the carriers 1 to 4.

Alternatively, in embodiments illustrated with respect to FIG. 9, there are both intra-carrier frequency hopping and across carrier frequency hopping for the repetitions of one data packet. More specifically, the number (namely, 4) of resource regions 910, 920, 930 and 940 is larger than the number (namely, 2) of carriers 1 and 2. That is, one carrier includes more than one resource regions allocated to the terminal device 102. The distribution within one carrier also referred to as the intra-carrier frequency hopping.

According to embodiments of the present disclosure, the frequency hopping may be implemented in several ways. In an embodiment, the information about the position and the size of each of the allocated resource regions may be sent to the terminal device 102. In this way, the terminal device 102 may determine the position and/or size of each allocated resource region.

In an alternative embodiment, the network device 101 may allocate the resource regions based on a frequency hopping pattern. The frequency hopping pattern may define positions of the resource regions, and/or the sizes of the resource regions. In an embodiment, the size of each resource region may be preset as a fixed value. In this case, the frequency hopping pattern may just define the positions of the resource regions. Additionally or alternatively, in an embodiment, the frequency hopping pattern may define positions of the allocated resource regions, and may include one or more of: a number of resource regions in a carrier, a position of a resource region in a carrier, a size of a resource region in frequency domain, a transmission time interval corresponding to a resource region, and/or the like. In this way, the intra-carrier frequency hopping and/or across carrier frequency hopping may be defined by the frequency hopping pattern.

In some embodiments, the frequency hopping pattern may be transmitted to the terminal device via a RRC signaling or predefined at both the network device and the terminal device. More specifically, the frequency hopping pattern may be preconfigured via a RRC signal for a terminal device to reduce the information carried in DCI for grant assignment. For instance, it can be predefined that same number of PRBs are allocated for each repetition and only distances of the resources for the repetitions with respect to the resource allocation of the first transmission are indicated. With the frequency hopping pattern, the number of grants used to schedule TTI bundling may be less than the number of the allocated resource regions.

According to embodiments of the present disclosure, which are different from TTI bundling in LTE, for each TTI of the consecutive TTIs, different PRBs may be allocated to the terminal device 102. The PRB positions in consecutive TTIs may conform to a frequency hopping pattern. The frequency hopping pattern may be defined by RRC signaling or predefined by standards at both the network device 101 and the terminal device 102 sides. As such, the terminal device 102 only needs to receive the grant for the first TTI. Accordingly, it can derive the PRB position in the following TTI(s) based on the frequency hopping pattern.

Still referring to FIG. 2, at 220, the network device 101 transmits information about the resource regions to the terminal device 102 to enable the terminal device 102 to perform uplink transmission of the data packet based on the information. As such, the network device 101 schedules repeated transmissions of one data packet for the terminal device with different frequency resources across different carriers in consecutive uplink TTI/subframes/slots.

Upon receipt of the information about the allocated resource regions, the terminal device 102 uses the resource regions to transmit the same data packet. As such, the same data packet can be transmitted by the terminal device 102 on different carriers in consecutive TTIs.

In some embodiments, the network device 101 may notify the terminal device 102, for example, via a RRC signaling, to start a duplication of a data packet, as well as how many duplications of the data packet are needed. Alternatively, in some embodiments, the network device 101 may just notify the terminal device 102 to start a duplication via a RRC signaling, while the terminal device 102 may know how many duplication is needed via a physical uplink grant.

Compared with the conventional solutions, since there is no power division between the transmissions on different carriers, the SINR can be increased without having any negative effect on the frequency diversity. At the same time, the PAPR increase can be avoided. In this way, both high reliability and low latency can be achieved.

According to embodiments of the present disclosure, if the data packet is a RLC PDU, it can be determined that the HARQ process is not allowed to work across different carriers. In this case, as it is not possible to do soft combining across different carriers, the network device 101 may allocate an uplink (UL) grant to the terminal device 102 for different carriers explicitly and independently. The transport block (TB) size may be different at different carriers as long as each TB size is enough to carry the data packet.

When terminal device 102 receives such a UL grant, it may transmit this data packet via each of the different carriers in the first transmission.

At the side of the network device 101, if it can decode one TB from any of the carriers successfully, it may acknowledge the successful transmission in that carrier. Additionally, in some embodiments, the network device 101 may further acknowledge the successful transmission in other carrier(s) as well.

Figure 3:
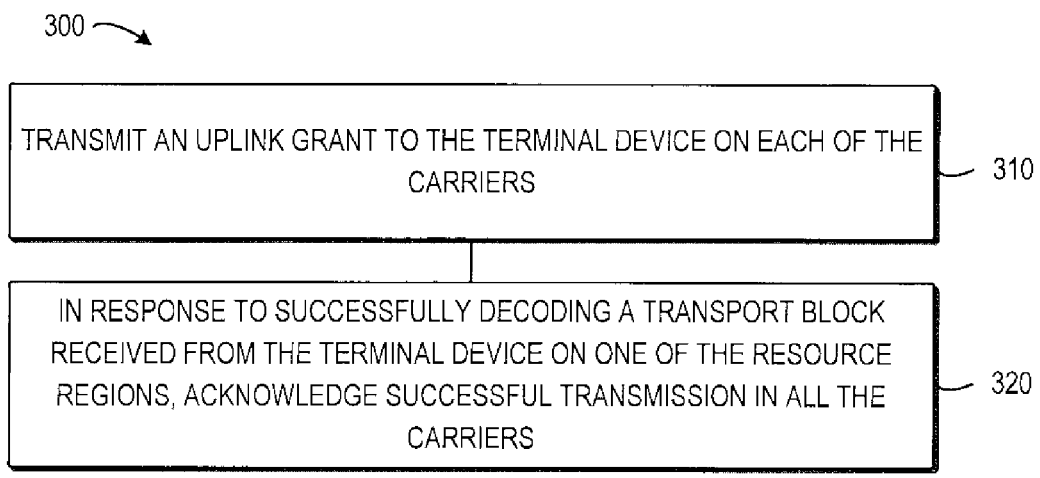
FIG. 3 shows a flowchart of a method 300 of performing uplink transmission at a network device in accordance with an embodiment of the present disclosure.

FIG. 3 shows a flowchart of a method 300 of performing uplink transmission at a network device according to embodiments of the present disclosure. The method 300 may be considered as further implementations of the method 200. In embodiments described with respect to FIG. 3, the data packet is a RLC PDU, and thus the HARQ process is not allowed to work across different carriers. It is to be understood that the method 300 are just described for example, rather than suggesting any limitations.

At 310, the network device 101 transmits an uplink grant to the terminal device on each of the carriers, the uplink grant includes a size of a transport block equal to or larger than a size of the data packet. In addition, or alternatively, at 320, in response to successfully decoding a transport block received from the terminal device 102 on one of the resource regions, the network device 101 acknowledges successful transmission in all the carriers.

According to embodiments of the present disclosure, if the data packet is a MAC PDU, it can be determined that the HARQ process is allowed to work across different carriers. In this case, as it is possible to do soft combining across different carrier, the grant for different carriers may be coupled. The network device 101 may need to make sure at least the TB sizes of the grants in different carriers are the same. The network device 101 may either transmit a UL grant to the terminal device 102 for each carrier respectively, or may just schedule the terminal device 102 in the first carrier with one UL grant. The terminal device 102 may derive the UL grant to be used in another carrier according to a rule which is defined by RRC signaling, or predefined according to standards.

At the side of the terminal device 102, when it receives such a UL grant and knows it is possible to do soft combining, it may send a first version of a TB in the first carrier, and a second version of the same TB in second carrier, and so on.

From the side of the network device 101, when it receives a TB from the terminal device 102, it may try to tentatively decode the first version. If the tentative decoding is not possible, it may perform a soft combining for the first version and second version, and try to decode again. In addition, the network device 101 may acknowledge the success of packet transmission to all carriers.

Figure 4:
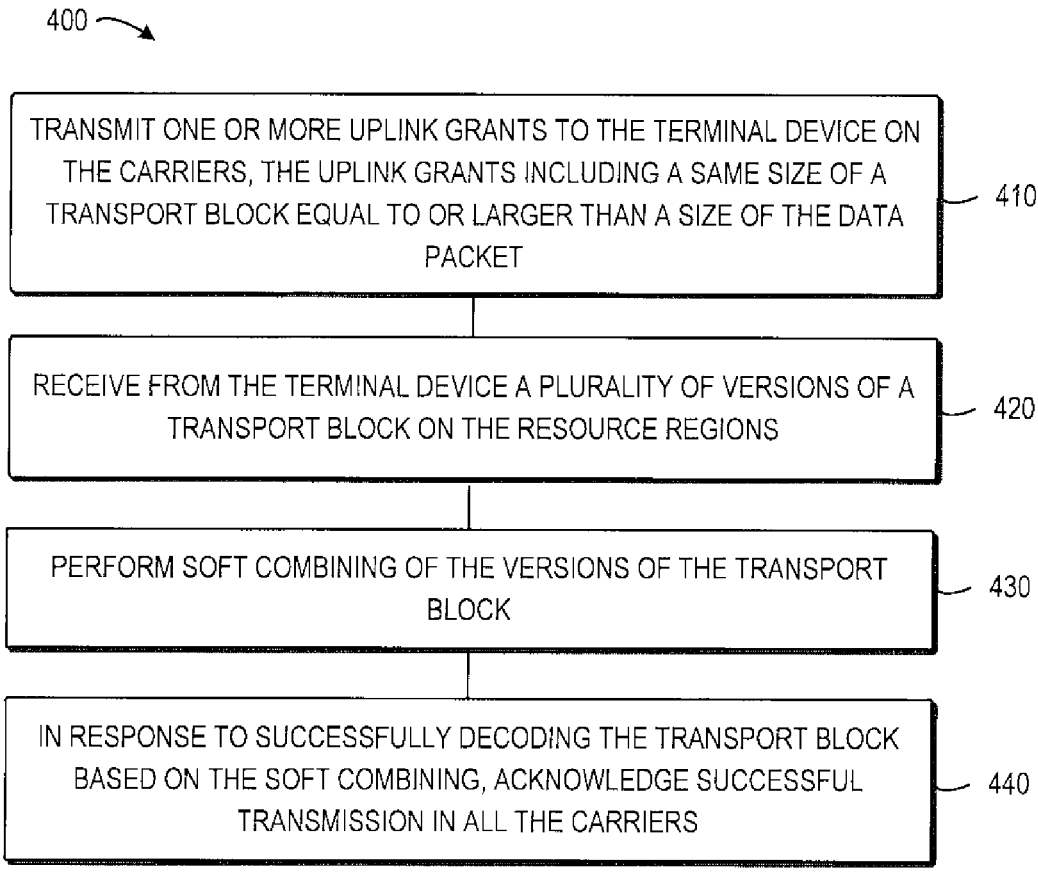
FIG. 4 shows a flowchart of a method 400 of performing uplink transmission at a network device in accordance with another embodiment of the present disclosure.

FIG. 4 shows a flowchart of a method 400 of performing uplink transmission at a network device in accordance with another embodiment of the present disclosure. The method 400 may be considered as further implementations of the method 200. In embodiments described with respect to FIG. 4, the data packet is a MAC PDU, and thus the HARQ process is allowed to work across different carriers. It is to be understood that the method 400 are just described for example, rather than suggesting any limitations.

At 410, the network device 101 transmits one or more uplink grants to the terminal device 102 on the carriers. The uplink grants may include a same size of a transport block equal to or larger than a size of the data packet. At 420, the network device 101 receives from the terminal device 102 a plurality of versions of a transport block on the resource regions. At 430, the network device 101 may perform soft combining of the versions of the transport block. At 440, in response to successfully decoding the transport block based on the soft combining, the network device 101 acknowledges successful transmission in all the carriers.

Figure 5:
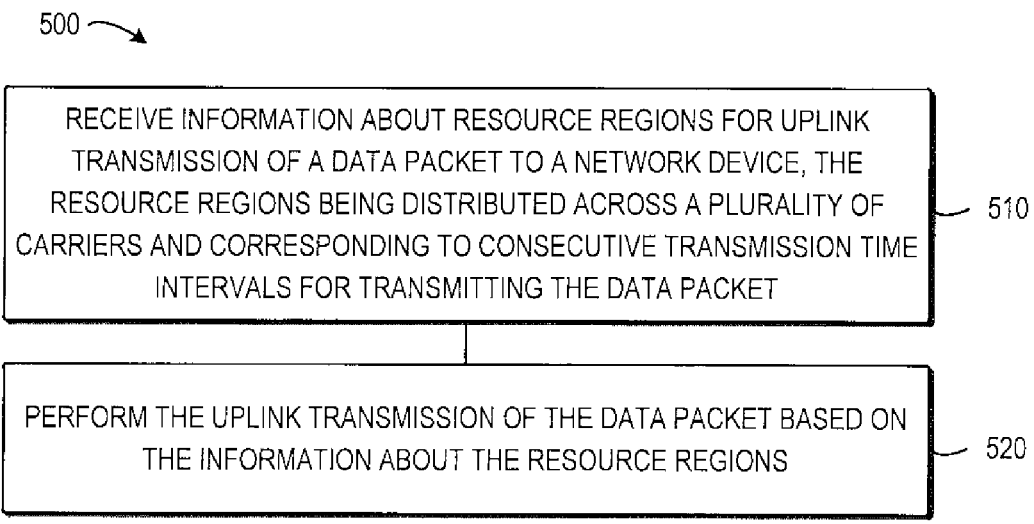
FIG. 5 shows a flowchart of a method 500 of performing uplink transmission at a terminal device in accordance with an embodiment of the present disclosure.
Figure 6:
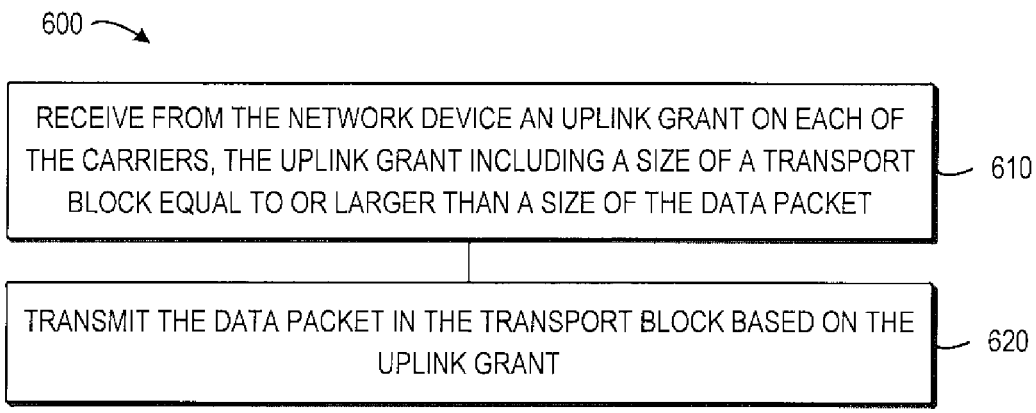
FIG. 6 shows a flowchart of a method 600 of performing uplink transmission at a terminal device in accordance with an embodiment of the present disclosure.
Figure 7:
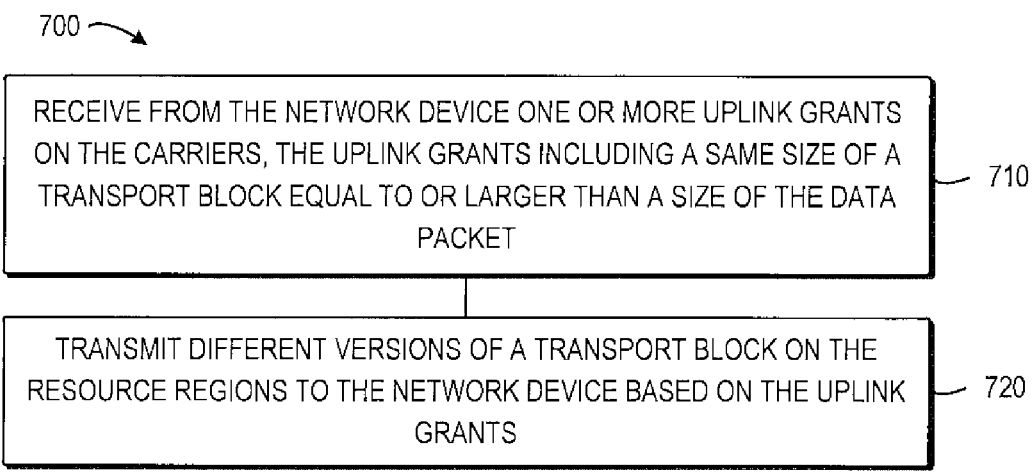
FIG. 7 shows a flowchart of a method 700 of performing uplink transmission at a terminal device in accordance with another embodiment of the present disclosure.

Now more embodiments are discussed with respect to FIGS. 5-7. Reference is now made to FIG. 5, which shows a flowchart of a method 500 of performing uplink transmission at a terminal device in accordance with an embodiment of the present disclosure. It would be appreciated by those skilled in the art that the method 500 may be implemented by a terminal device, such as a UE, a mobile phone or other suitable devices. The terminal device may be, for example, but not limited to, the terminal device 102 of FIG. 1. In the following embodiments, the terminal device 102 is discussed as the example of the terminal device. It is to be understood that the terminal device 102 is just an example, rather than suggesting any limitation.

The method 500 is entered at 510, where the terminal device 102 receives information about resource regions for uplink transmission of a data packet to a network device. The resource regions are distributed across a plurality of carriers and correspond to consecutive transmission time intervals for transmitting the data packet. At 520, the terminal device 102 performs the uplink transmission of the data packet based on the information about the resource regions.

In some embodiments, before performing the uplink transmission of the data packet, the terminal device 102 may determine the resource regions based on information about resource regions and a frequency hopping pattern. The frequency hopping pattern may define positions of the resource regions and may include: a number of resource regions in a carrier, a position of a resource region in a carrier, a size of a resource region in frequency domain, a transmission time interval corresponding to a resource region, and so on. By means of the frequency hopping pattern, positions and/sizes of one or more resource regions may be indicated.

In some embodiments, the frequency hopping pattern may be received from the network device via a RRC signaling or predefined at both the network device and the terminal device sides.

In some embodiments, the data packet to be transmitted by the terminal device 102 is a RLC PDU. That is to say, the HARQ process is not allowed to work across different carriers. FIG. 6 shows a flowchart of a method 600 of performing uplink transmission at a terminal device in this case. The method 600 may be considered as further implementations of the method 500. In embodiments described with respect to FIG. 6, the data packet is a RLC PDU, and thus the HARQ process is not allowed to work across different carriers. It is to be understood that the method 600 are just described for example, rather than suggesting any limitations.

At 710, the terminal device 102 receives from the network device an uplink grant on each of the carriers. The uplink grant may include a size of a transport block equal to or larger than a size of the data packet. At 720, the terminal device 102 transmits the data packet in the transport block based on the uplink grant.

Alternatively, in some embodiments, the data packet to be transmitted by the terminal device 102 is a MAC PDU. That is to say, the HARQ process is allowed to work across different carriers. FIG. 7 shows a flowchart of a method 700 of performing uplink transmission at a terminal device in this case. The method 700 may be considered as further implementations of the method 500. In embodiments described with respect to FIG. 7, the data packet is a MAC PDU, and thus the HARQ process is allowed to work across different carriers. It is to be understood that the method 700 are just described for example, rather than suggesting any limitations.

At 710, the terminal device 102 receives, from the network device 101, one or more uplink grants on the carriers. The uplink grants may include a same size of a transport block equal to or larger than a size of the data packet. The terminal device transmits, at 720, different versions of a transport block on the resource regions to the network device based on the uplink grants.

Figure 10:
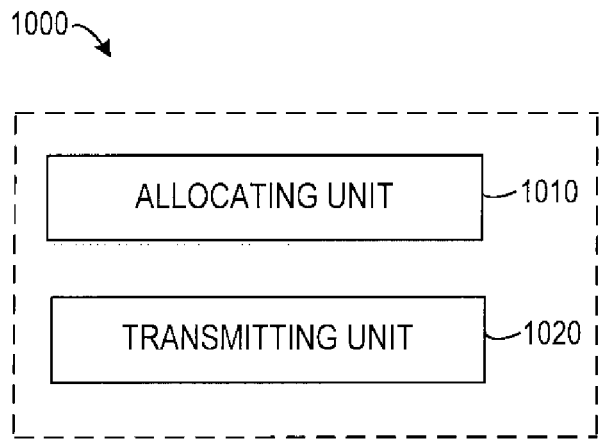
FIG. 10 shows a block diagram of an apparatus 1000 implemented at a network device in accordance with an embodiment of the present disclosure.

Now reference is made to FIG. 10, which shows a block diagram of an apparatus 1000 in accordance with an embodiment of the present disclosure. It would be appreciated that the apparatus 1000 may be implemented at a network device 101 or any other suitable device.

As shown, the apparatus 1000 includes an allocating unit 1010 and a transmitting unit 1020. The allocating unit 1010 is configured to allocate resource regions for uplink transmission of a data packet of a terminal device. The resource regions are distributed across a plurality of carriers and correspond to consecutive transmission time intervals for transmitting the data packet. The transmitting unit 1020 is configured to transmit information about the resource regions to the terminal device to enable the terminal device to perform uplink transmission of the data packet based on the information.

In an embodiment, the allocating unit 1010 may be further configured to: allocate the resource regions based on a frequency hopping pattern defining positions of the resource regions. The frequency hopping pattern may include one or more of: a number of resource regions in a carrier; a position of a resource region in a carrier; a size of a resource region in frequency domain; and a transmission time interval corresponding to a resource region.

In an embodiment, the frequency hopping pattern is transmitted to the terminal device via a RRC signaling or predefined at both the network device and the terminal device.

In an embodiment, the data packet is a RLC PDU, and the transmitting unit 1020 is further configured to: transmit an uplink grant to the terminal device on each of the carriers, the uplink grant including a size of a transport block equal to or larger than a size of the data packet; and in response to successfully decoding a transport block received from the terminal device on one of the resource regions, acknowledge successful transmission in all the carriers.

In an embodiment, the data packet is a MAC PDU, and the transmitting unit 1020 may be further configured to: transmit one or more uplink grants to the terminal device on the carriers, the uplink grants including a same size of a transport block equal to or larger than a size of the data packet. The network device may further comprise a processing unit configured to, in response to receiving from the terminal device a plurality of versions of a transport block on the resource regions; perform soft combining of the versions of the transport block. The transmitting unit 1020 may be further configured to: in response to successfully decoding the transport block based on the soft combining, acknowledge successful transmission in all the carriers.

Figure 11:
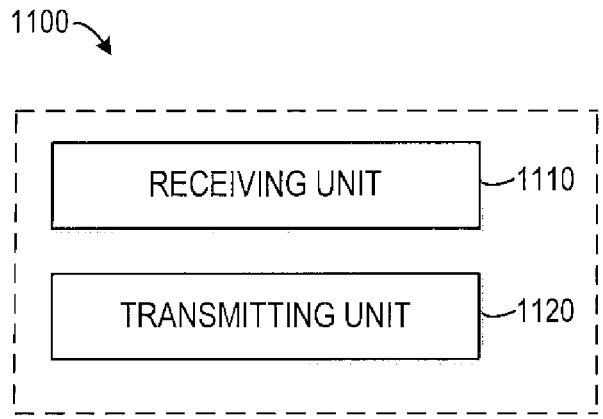
FIG. 11 shows a block diagram of an apparatus 1100 implemented at a terminal device in accordance with an embodiment of the present disclosure.

Now reference is made to FIG. 11, which shows a block diagram of an apparatus 1100 in accordance with an embodiment of the present disclosure. It would be appreciated that the apparatus 1100 may be implemented at a terminal device 102 or any other suitable device.

As shown, the apparatus 1100 includes a receiving unit 1110 and a transmitting unit 1120. The receiving unit 1110 is configured to receive information about resource regions for uplink transmission of a data packet to a network device. The resource regions are distributed across a plurality of carriers and correspond to consecutive transmission time intervals for transmitting the data packet. The transmitting unit 1120 is configured to perform the uplink transmission of the data packet based on the information about the resource regions.

In an embodiment, the terminal device may further comprise a processing unit configured to: determine the resource regions based on information about resource regions and a frequency hopping pattern defining positions of the resource regions. The frequency hopping pattern may include one or more of: a number of resource regions in a carrier; a position of a resource region in a carrier; a size of a resource region in frequency domain; and a transmission time interval corresponding to a resource region.

In an embodiment, the frequency hopping pattern may be received from the network device via a RRC signaling or predefined at both the network device and the terminal device.

In an embodiment, the data packet may be a RLC PDU, and the receiving unit 1110 may be further configured to: receive from the network device an uplink grant on each of the carriers, the uplink grant including a size of a transport block equal to or larger than a size of the data packet. The transmitting unit 1120 may be further configured to: transmit the data packet in the transport block based on the uplink grant.

In an embodiment, the data packet is a MAC PDU, and the receiving unit 1110 may be further configured to: receive from the network device one or more uplink grants on the carriers, the uplink grants including a same size of a transport block equal to or larger than a size of the data packet. The transmitting unit 1120 may be further configured to: transmit different versions of a transport block on the resource regions to the network device based on the uplink grants.

It should be appreciated that components included in the apparatus 1000 correspond to the operations of the methods 200-400, and components included in the apparatus 1100 correspond to the operations of the methods 500-700. Therefore, all operations and features described above with reference to FIGS. 2-4 are likewise applicable to the components included in the apparatus 1000 and have similar effects, and all operations and features described above with reference to FIGS. 5-7 are likewise applicable to the components included in the apparatus 1100 and have similar effects. For the purpose of simplification, the details will be omitted.

The components included in the apparatuses 1000 and 1100 may be implemented in various manners, including software, hardware, firmware, or any combination thereof. In one embodiment, one or more units may be implemented using software and/or firmware, for example, machine-executable instructions stored on the storage medium. In addition to or instead of machine-executable instructions, parts or all of the components included in the apparatuses 1000 and 1100 may be implemented, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), and the like.

In accordance with embodiments of the present disclosure, there is provided an apparatus implemented at a network device. The apparatus includes: means for allocating resource regions for uplink transmission of a data packet of a terminal device, the resource regions being distributed across a plurality of carriers and corresponding to consecutive transmission time intervals for transmitting the data packet; and means for transmitting information about the resource regions to the terminal device to enable the terminal device to perform uplink transmission of the data packet based on the information.

In an embodiment, the means for allocating resource regions for uplink transmission of a data packet of a terminal device comprises: means for allocating the resource regions based on a frequency hopping pattern defining positions of the resource regions. The frequency hopping pattern may include one or more of: a number of resource regions in a carrier; a position of a resource region in a carrier; a size of a resource region in frequency domain; and a transmission time interval corresponding to a resource region.

In an embodiment, the frequency hopping pattern is transmitted to the terminal device via a Radio Resource Control, RRC, signaling or predefined at both the network device and the terminal device.

In an embodiment, the data packet is a RLC PDU, and the apparatus may further comprise at least one of: means for transmitting an uplink grant to the terminal device on each of the carriers, the uplink grant including a size of a transport block equal to or larger than a size of the data packet; and means for in response to successfully decoding a transport block received from the terminal device on one of the resource regions, acknowledging successful transmission in all the carriers.

In an embodiment, the data packet is a MAC PDU, and the apparatus may further comprise at least one of: means for transmitting one or more uplink grants to the terminal device on the carriers, the uplink grants including a same size of a transport block equal to or larger than a size of the data packet; and means for, in response to receiving from the terminal device a plurality of versions of a transport block on the resource regions, performing soft combining of the versions of the transport block, and in response to successfully decoding the transport block based on the soft combining, acknowledging successful transmission in all the carriers.

In accordance with embodiments of the present disclosure, there is provided an apparatus implemented at a terminal device. The apparatus includes: means for receiving information about resource regions for uplink transmission of a data packet to a network device, the resource regions being distributed across a plurality of carriers and corresponding to consecutive transmission time intervals for transmitting the data packet; and means for performing the uplink transmission of the data packet based on the information about the resource regions.

In an embodiment, the means for performing the uplink transmission based on the information about the resource regions comprises: means for determining the resource regions based on information about resource regions and a frequency hopping pattern defining positions of the resource regions. The frequency hopping pattern includes one or more of: a number of resource regions in a carrier; a position of a resource region in a carrier; a size of a resource region in frequency domain; and a transmission time interval corresponding to a resource region.

In an embodiment, the frequency hopping pattern is received from the network device via a RRC signaling or predefined at both the network device and the terminal device.

In an embodiment, the data packet is a RLC PDU and the apparatus may further comprise: means for receiving from the network device an uplink grant on each of the carriers, the uplink grant including a size of a transport block equal to or larger than a size of the data packet; and means for transmitting the data packet in the transport block based on the uplink grant.

In an embodiment, the data packet is a MAC PDU and the apparatus may further comprise: mean for receiving from the network device one or more uplink grants on the carriers, the uplink grants including a same size of a transport block equal to or larger than a size of the data packet; and means for transmitting different versions of a transport block on the resource regions to the network device based on the uplink grants.

Figure 12:
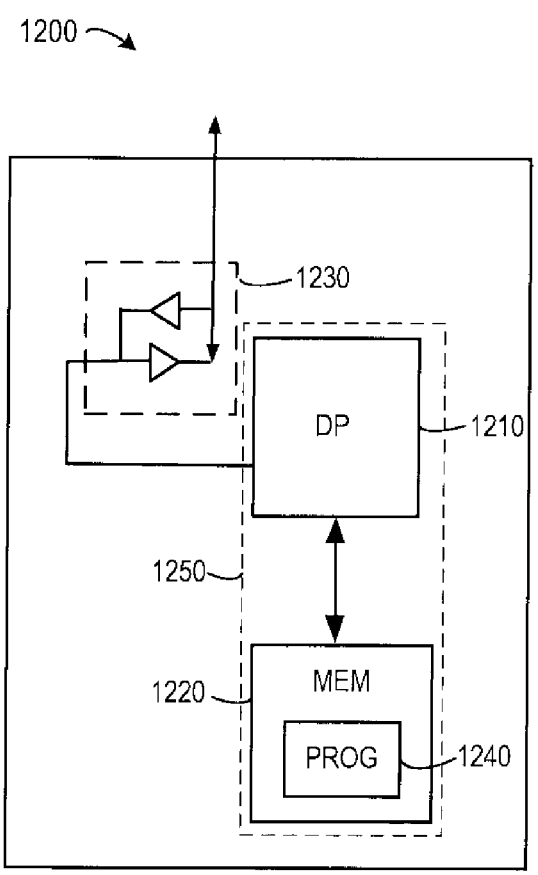
FIG. 12 shows a simplified block diagram 1200 of a device that is suitable for use in implementing embodiments of the present disclosure.

FIG. 12 shows a simplified block diagram of a device 1200 that is suitable for implementing embodiments of the present disclosure. It would be appreciated that the device 1200 may be implemented as at least a part of, for example, the network device 101 or the terminal device 102.

As shown, the device 1200 includes a communicating means 1230 and a processing means 1250. The processing means 1250 includes a data processor (DP) 1210, a memory (MEM) 1220 coupled to the DP 1210. The communicating means 1230 is coupled to the DP 1210 in the processing means 1250. The MEM 1220 stores a program (PROG) 1240. The communicating means 1230 is for communications with other devices, which may be implemented as a transceiver for transmitting/receiving signals.

In some embodiments where the device 1200 acts as a network device, the processing means 1250 may be configured to allocate resource regions for uplink transmission of a data packet of a terminal device, the resource regions being distributed across a plurality of carriers and corresponding to consecutive transmission time intervals for transmitting the data packet; and the communicating means 1230 may be configured to transmit information about the resource regions to the terminal device to enable the terminal device to perform uplink transmission of the data packet based on the information. In some other embodiments where the device 1200 acts as a terminal device, the communicating means 1230 may be configured to receive information about resource regions for uplink transmission of a data packet to a network device, the resource regions being distributed across a plurality of carriers and corresponding to consecutive transmission time intervals for transmitting the data packet; and perform the uplink transmission of the data packet based on the information about the resource regions.

The PROG 1240 is assumed to include program instructions that, when executed by the associated DP 1210, enable the device 1200 to operate in accordance with the embodiments of the present disclosure, as discussed herein with the methods 200-400 or 500-700. The embodiments herein may be implemented by computer software executable by the DP 1210 of the device 1200, or by hardware, or by a combination of software and hardware. A combination of the data processor 1210 and MEM 1220 may form processing means 1250 adapted to implement various embodiments of the present disclosure.

The MEM 1220 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one MEM is shown in the device 1200, there may be several physically distinct memory modules in the device 1200. The DP 1210 may be of any type suitable to the local technical environment, and may include one or more of general purpose computers, special purpose computers, microprocessors, digital signal processors (DSPs) and processors based on multicore processor architecture, as non-limiting examples. The device 1200 may have multiple processors, such as an application specific integrated circuit chip that is slaved in time to a clock which synchronizes the main processor.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine readable medium may be a machine readable signal medium or a machine readable storage medium. The machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this disclosure, the device may be implemented in the general context of computer system-executable instructions, such as program modules, being executed by a computer system. Generally, program modules may include routines, programs, objects, components, logic, data structures, and so on that perform particular tasks or implement particular abstract data types. The device may be practiced in distributed cloud computing environments where tasks are performed by remote processing devices that are linked through a communications network. In a distributed cloud computing environment, program modules may be located in both local and remote computer system storage media including memory storage devices.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A method implemented at a network device, comprising:
    allocating resource regions for uplink transmission of a data packet of a terminal device based on a frequency hopping pattern defining positions of the resource regions, the resource regions being distributed across a plurality of carriers and corresponding to consecutive transmission time intervals, a first transmission time interval of the consecutive transmission time intervals for transmitting the entire data packet, a second transmission time interval of the consecutive transmission time intervals for transmitting the entire data packet, wherein the data packet is a Radio Link Control, RLC, Protocol Data Unit, PDU;
    transmitting information about the resource regions to the terminal device to enable the terminal device to perform uplink transmission of the data packet based on the information; and
    in response to successfully decoding a RLC PDU received from the terminal device on at least one, but fewer than all, of the resource regions, acknowledging successful transmission of the RLC PDU in all the carriers.

2. The method according to claim 1, wherein the frequency hopping pattern includes one or more of:
    a number of resource regions in a carrier;
    a position of a resource region in a carrier;
    a size of a resource region in frequency domain; and a transmission time interval corresponding to a resource region.

3. The method according to claim 2, wherein the frequency hopping pattern is transmitted to the terminal device via a Radio Resource Control, RRC, signaling or predefined at both the network device and the terminal device.

4. A computer program product being tangibly stored on a computer readable non-transitory storage medium and including instructions which, when executed on a processor of a network device, cause the network device to perform the method according to claim 1.

5. A method implemented at a terminal device, comprising:
receiving information about resource regions for uplink transmission of a data packet to a network device, the resource regions being distributed across a plurality of carriers and corresponding to consecutive transmission time intervals, a first transmission time interval of the consecutive transmission time intervals for transmitting the entire data packet, a second transmission time interval of the consecutive transmission time intervals for transmitting the entire data packet, wherein the data packet is a Radio Link Control, RLC, Protocol Data Unit, PDU;
performing the uplink transmission of the data packet based on the information about the resource regions, including determining the resource regions based on information about resource regions and a frequency hopping pattern defining positions of the resource regions; and
in response to the uplink transmission being successfully decoded on at least one, but fewer than all, of the resource regions, receiving an acknowledgment of successful transmission in all the carriers.

6. The method according to claim 5, wherein the frequency hopping pattern includes one or more of:
a number of resource regions in a carrier;
a position of a resource region in a carrier;
a size of a resource region in frequency domain; and
a transmission time interval corresponding to a resource region.

7. The method according to claim 6, wherein the frequency hopping pattern is received from the network device via a Radio Resource Control, RRC, signaling or predefined at both the network device and the terminal device.

8. A computer program product being tangibly stored on a computer readable non-transitory storage medium and including instructions which, when executed on a processor of a terminal device, cause the terminal device to perform the method according to claim 5.

9. A network device, comprising:
a processor; and
a memory coupled to the processor and storing instructions thereon, the instructions, when executed by the processor, causing the network device to perform actions, the actions comprising:
allocating resource regions for uplink transmission of a data packet of a terminal device based on a frequency hopping pattern defining positions of the resource regions, the resource regions being distributed across a plurality of carriers and corresponding to consecutive transmission time intervals, a first transmission time interval of the consecutive transmission time intervals for transmitting the entire data packet, a second transmission time interval of the consecutive transmission time intervals for transmitting the entire data packet, wherein the data packet is a Radio Link Control, RLC, Protocol Data Unit, PDU;
transmitting information about the resource regions to the terminal device to enable the terminal device to perform uplink transmission of the data packet based on the information; and
in response to successfully decoding a RLC PDU received from the terminal device on at least one, but fewer than all, of the resource regions, acknowledging successful transmission of the RLC PDU in all the carriers.

10. The network device according to claim 9, wherein the frequency hopping pattern includes one or more of:
a number of resource regions in a carrier;
a position of a resource region in a carrier;
a size of a resource region in frequency domain; and
a transmission time interval corresponding to a resource region.

11. The network device according to claim 10, wherein the frequency hopping pattern is transmitted to the terminal device via a Radio Resource Control, RRC, signaling or predefined at both the network device and the terminal device.

12. A terminal device, comprising:
a processor; and
a memory coupled to the processor and storing instructions thereon, the instructions, when executed by the processor, causing the terminal device to perform actions, the actions comprising:
receiving information about resource regions for uplink transmission of a data packet to a network device, the resource regions allocated based on the resource regions being distributed across a plurality of carriers and corresponding to consecutive transmission time intervals, a first transmission time interval of the consecutive transmission time intervals for transmitting the entire data packet, a second transmission time interval of the consecutive transmission time intervals for transmitting the entire data packet, wherein the data packet is a Radio Link Control, RLC, Protocol Data Unit, PDU;
performing the uplink transmission of the data packet based on the information about the resource regions, including determining the resource regions based on information about resource regions and a frequency hopping pattern defining positions of the resource regions; and
in response to the uplink transmission being successfully decoded on at least one, but fewer than all, of the resource regions, receiving an acknowledgment of successful transmission in all the carriers.

13. The terminal device according to claim 12, wherein the frequency hopping pattern includes one or more of:
a number of resource regions in a carrier;
a position of a resource region in a carrier;
a size of a resource region in frequency domain; and
a transmission time interval corresponding to a resource region.

14. The terminal device according to claim 13, wherein the frequency hopping pattern is received from the network device via a Radio Resource Control, RRC, signaling or predefined at both the network device and the terminal device.

* * * * *